United States Patent
Baillie et al.

(10) Patent No.: US 7,023,087 B1
(45) Date of Patent: Apr. 4, 2006

(54) INTEGRATED CIRCUIT CARRIER AND METHOD OF MANUFACTURING AND INTEGRATED CIRCUIT

(75) Inventors: Matthew Brett Baillie, Emmaus, PA (US); Gary John Reichl, Coopersburg, PA (US)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 09/138,146

(22) Filed: Aug. 21, 1998

Related U.S. Application Data

(60) Provisional application No. 60/095,397, filed on Aug. 5, 1998.

(51) Int. Cl.
*H01L 23/12* (2006.01)
(52) U.S. Cl. ............... 257/730; 257/678; 206/710
(58) Field of Classification Search ............... 257/666, 257/676, 704, 730, 678; 206/701, 710, 711, 206/712, 714, 716

See application file for complete search history.

(56) References Cited

U.S. PATENT DOCUMENTS

| | | | |
|---|---|---|---|
| 3,825,803 A | * | 7/1974 | Budde |
| 4,565,288 A | * | 1/1986 | Walther |
| 4,711,350 A | * | 12/1987 | Yen |
| 5,012,386 A | * | 4/1991 | McShane et al. |
| 5,133,452 A | * | 7/1992 | Ohashi |
| 5,365,107 A | * | 11/1994 | Kuraishi et al. |
| 5,418,692 A | * | 5/1995 | Nemoto ............... 361/809 |
| 5,499,717 A | * | 3/1996 | Hayashi |
| 5,547,082 A | * | 8/1996 | Royer et al. ........... 206/725 |
| 5,964,353 A | * | 10/1999 | Hamlin |

FOREIGN PATENT DOCUMENTS

| | | |
|---|---|---|
| DE | 195 27 021 A1 | 1/1997 |
| JP | 05338616 A | 12/1993 |
| JP | 7 18499 | 3/1995 |

\* cited by examiner

*Primary Examiner*—S. V. Clark

(57) ABSTRACT

A process for manufacturing an integrated circuit including the steps of providing a chip carrier including a base, an inner well formed about the periphery of the base, and an outer well formed about the periphery of the inner well. An integrated circuit is positioned on the base. The process further includes the steps of pre or post processing the integrated circuit.

16 Claims, 3 Drawing Sheets

INTEGRATED CIRCUIT CARRIER AND METHOD OF MANUFACTURING AND INTEGRATED CIRCUIT

CROSS-REFERENCE TO RELATED APPLICATION

This application claims priority of Provisional Application Ser. No. 60/095,397 which was filed on Aug. 5, 1998.

FIELD OF THE INVENTION

The present invention relates generally to a process of integrated circuit manufacture and electronic devices and, particularly, to process for using a carrier tape to manufacture integrated circuits and electronic devices.

BACKGROUND OF THE INVENTION

There has been an increasing demand to improve the efficiency of manufacturing integrated circuits and electronic devices. One method for improving efficiency is using carrier tape packages to automate the manufacturing process. FIG. 4 is a schematic diagram of a carrier tape 400 holding a number of integrated circuits 410 positioned in a chip carrier 420. The carrier tape 400 is used to transport the integrated circuits 410 and allow the integrated circuits 410 to be retrieved from the carrier using automated manufacturing equipment. For example, the carrier tape 400 may be fed to an apparatus which retrieves the integrated circuits from the carrier tape and populates a circuit board.

FIG. 5 is a schematic diagram along line 5—5 of the chip carrier 420 for holding an integrated circuit 410 in a carrier tape 400 according to the prior art. The chip carrier 420 includes a base 520 for receiving an integrated circuit 410. A well 530 is formed around the base 520. An integrated circuit is held in the chip carrier 420 by a cover 540 which is attached to the upper surface 510 by an adhesive. The integrated circuit 410 disposed in the chip carrier 420 may be damaged if force from, for example, an impact is applied to the wall 532. The leads of the integrated circuit 410 may be damaged from such an impact. In addition, the chip carrier 420 may be susceptible to impacts on the bottom 520 of the chip carrier 420. As a result, it is desirable to provide a chip carrier which reduces the potential damaged to an integrated circuit disposed in the chip carrier.

SUMMARY OF THE INVENTION

The present invention provides a process of manufacturing an integrated circuit. The process includes the steps of providing a chip carrier including a base, an inner well formed about the periphery of the base, and an outer well formed about the periphery of the inner well. An integrated circuit is positioned on the base. The process further includes the steps of pre or post processing the integrated circuit.

The present invention is also directed to a process of transporting an integrated circuit using a chip carrier including a base, an inner well formed about the periphery of the base, and an outer well formed about the periphery of the inner well.

It is to be understood that both the foregoing general description and the following detailed description are exemplary, but are not restrictive, of the invention.

BRIEF DESCRIPTION OF THE DRAWING

The invention is best understood from the following detailed description when read in connection with the accompanying drawing. It is emphasized that, according to common practice in the semiconductor industry, the various features of the drawing are not to scale. On the contrary, the dimensions of the various features are arbitrarily expanded or reduced for clarity. Included in the drawing are the following figures.

DETAILED DESCRIPTION OF THE INVENTION

The illustrative embodiment of the present invention provides a chip carrier that includes a double well structure including an inner well and an outer well. The double well structure forms a flexible structure that adsorbs the force generated by impacts. In addition, the outer well is deeper than the inner well to provide crush protection from bottom side impacts. As a result, a device positioned in the chip carrier may be protected from damage.

Figure 1:
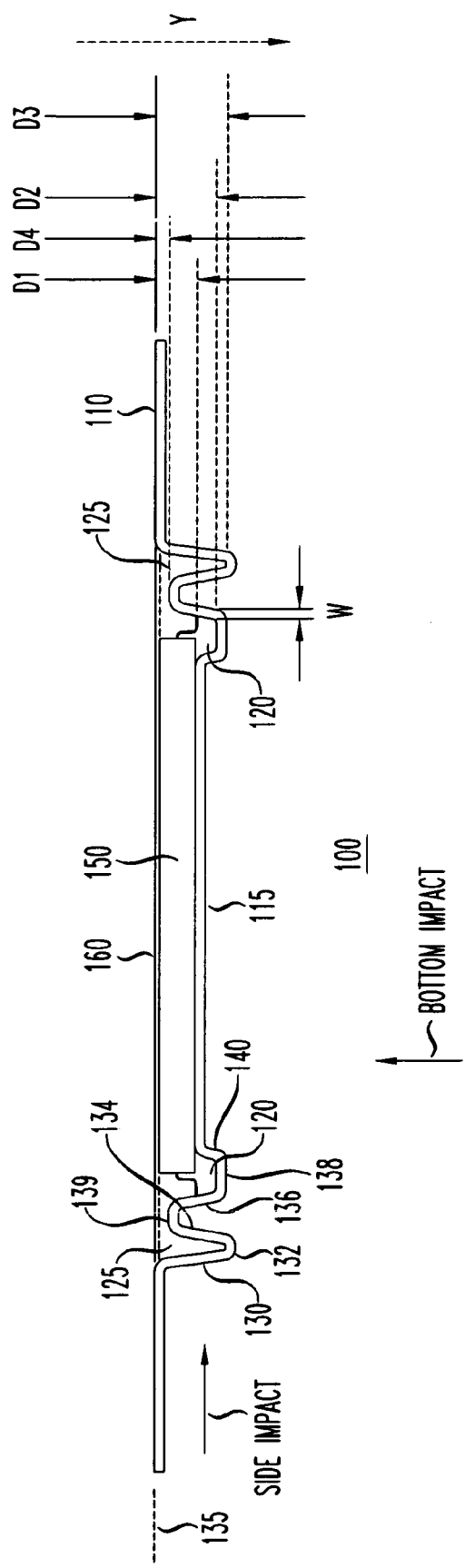
FIG. 1 is a schematic diagram of a chip carrier according to an illustrative embodiment of the present invention.

Referring now to the drawing, wherein like reference numerals refer to like elements throughout, FIG. 1 is a schematic diagram of a chip carrier 100 according to an illustrative embodiment of the present invention. The chip carrier 100 includes an upper service 110 and a base 115. Adjacent to and disposed around the base 115 is an inner well 120. An outer well 125 is positioned adjacent to and disposed around the inner well 120. The walls 130, 134, and 136 of the inner well 120 and the outer well 125 form an S-shape.

The outer well 125 includes a first wall 130 extending from the upper surface 110 towards a first position 132 and a second wall 134 extending from the first position 132 towards a reference plane 135 defined by the upper surface 110. The inner well 120 includes a third wall 136 extending away from the reference plane towards a second position 138 and a fourth wall 140 extending away from the second position 1381<A cover 160 is fixed to the upper surface 110 to hold the integrated circuit 150 in the chip carrier 100. The cover 160 is attached to the upper surface 110 by, for example, an adhesive.

Figure 2:
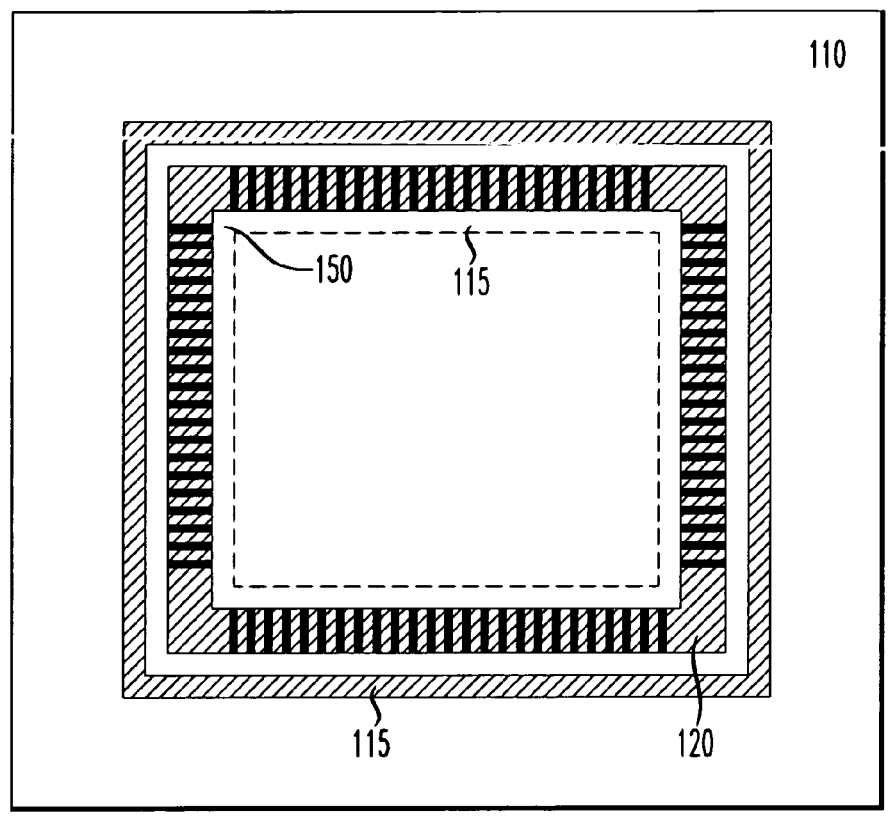
FIG. 2 is a top view of the chip carrier shown in FIG. 1.

FIG. 2 is a top view of the chip carrier 100 along line 2—2. The bottom of the inner well 120 and the bottom of the outer well 125 are identified by cross hatching. The cover 160 of the chip carrier 160 has been removed for clarity. The inner well 120 and the outer well 125 may or may not be continuous. For example, the inner and outer wells may be continuously formed to protect the leads of an integrated circuit having leads formed on four sides (e.g., a quad flat pack). Alternatively, if the integrated circuit includes leads on two sides, the inner and out wells may be formed adjacent to the leads and not adjacent to the other sides that do not contain leads.

The outer well 125 and the inner well 120 protect an integrated circuit 150 positioned on the base 115 from impacts to the chip carrier 100 on the wall 130. During a side impact, the walls 130, 134, and 136 move absorbing the force of the impact and preventing lead damage. In other words, the S-shape of the walls compresses absorbing the force of side impacts. In addition, the outer well 125 is slightly deeper than the inner well 120 in the y-direction. In other words, the outer well 125 extends farther away from the upper surface 110 than the inner well 120. As a result, the outer well 125 protects an integrated circuit from damage caused by impacts on the bottom of the chip carrier 100. For example, an object impacting the chip carrier 100 contacts the outer well 125 which absorbs the impact without transferring the impact energy to the integrated circuit 150. Accordingly, large integrated circuits with fragile leads such as quad flat pack packages (e.g., MQFP, SQFP, and TQFP packages) may be shipped using tape and reel packed shipment.

In an illustrative embodiment, the base 115 extends a distance D1 of 0.059 inches below the upper surface 110. The second position 138 extends a distance D2 of 0.094 inches below the upper surface 110. The first position 132 extends a distance D3 of 0.107 inches from the upper surface 110. The position 139 between the inner well 120 and the outer well 125 extends a distance D4 of 0.011 inches from the upper surface 110. Distance D4 may range from 0.005 inches to 0.025 inches, depending on the desired flexibility. The chip carrier may be constructed from polycarbonate resin, polystyrene resin, PVC resin, or PET (polyethylene) resin. Carrier tapes may require ESD protection in the form of carbon coating or filling of the tape. The thickness or width W of the material from which the material for the tape carrier 100 is embossed, drawn, or vacuum formed is usually in the range of 0.010 inches to 0.015 inches. Some sections of the carrier tape following the forming operation may be as thin as 0.006 inches.

Figure 3:
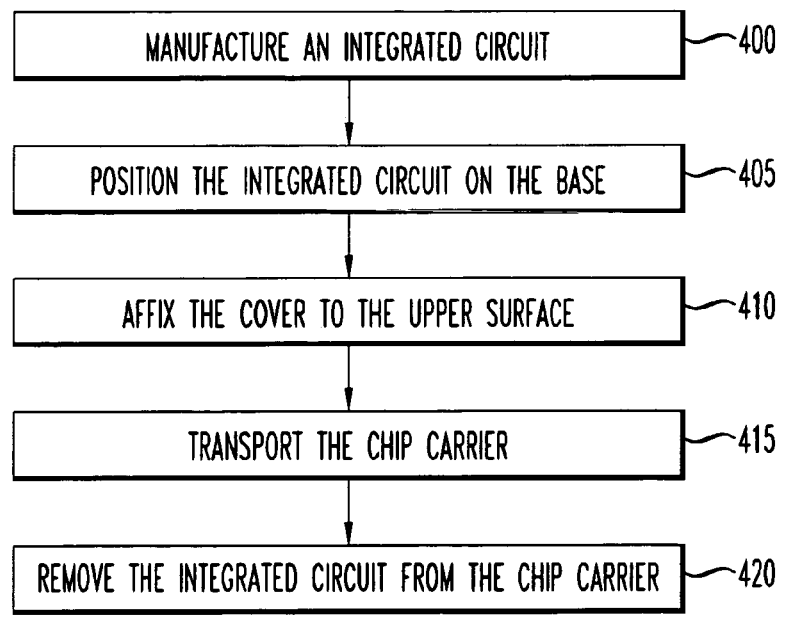
FIG. 3 is a flow chart diagram for manufacturing an electronic device.
Figure 4:
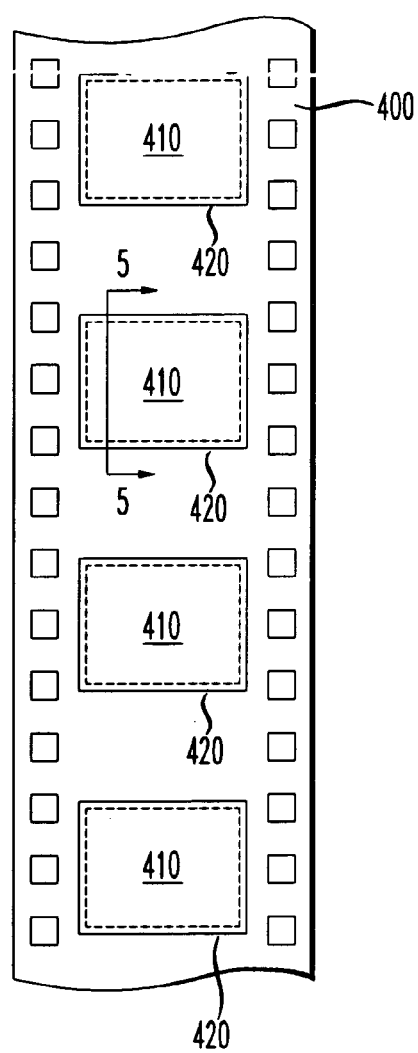
FIG. 4 is a top view of a carrier tape according to the prior art.
Figure 5:
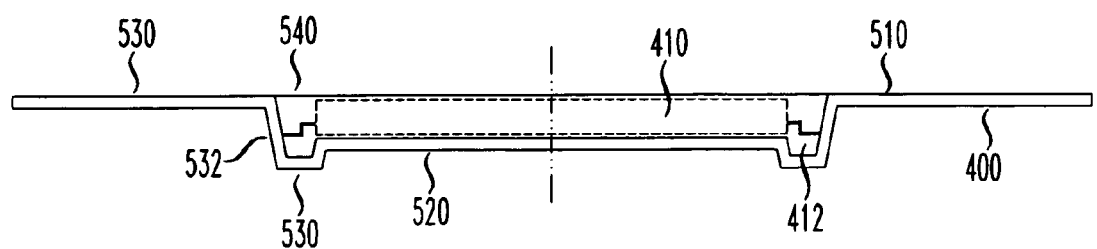
FIG. 5 is a cross sectional view along line 5—5 of the carrier tape shown in FIG. 4.

FIG. 3 is directed to another exemplary embodiment of the chip carrier shown in FIGS. 1 and 2. At step 400, an integrated circuit is manufactured. The process for manufacturing an integrated circuit is described in *Silicon Processing for the VLSI Era*, Vols. 1–3 by Stanley Wolf, Lattice Press (1990). At step 405, the integrated circuit is placed on the base 115 (shown in FIG. 1) using, for example, an automated transfer device (not shown). At step 410, the cover is affixed to the upper service 110 of the chip carrier 100 to hold the integrated circuit in position. At step 415, the chip carrier 100 is transported. For example, the chip carrier 100 may be transported for use in another manufacturing tool located in the same facilities where the integrated circuit was manufactured. Alternatively, the chip carrier 100 may be transported to another physical location. The chip carrier 100 may be transferred by automated equipment, airplane, truck, and/or other transportation systems, alone or in combination. At step 420, the integrated circuit is removed from the chip carrier 100 for further processing. The further processing may include additional manufacturing processes to complete the integrated circuit. Alternatively, the integrated circuit may be used to populate a circuit board as is well-known in the art. In addition, the integrated circuit may be used in the manufacture of other electronic equipment.

Although the invention has been described with reference to exemplary embodiments, it is not limited to those embodiments. Rather, the appended claims should be construed to include other variants and embodiments of the invention which may be made by those skilled in the art without departing from the true spirit and scope of the present invention.

The invention claimed is:

1. A chip carrier comprising:
   a base having a surface and a periphery;
   an inner well having a periphery extending along the periphery of the base and wherein the inner well has a second base having a second depth between the second base and the surface;
   an outer well extending along the periphery of the inner well, and wherein the outer well has a first base having a first depth between the first base and the surface, wherein the first depth is greater than the second depth.

2. The chip carrier according to claim 1 wherein the inner well and the outer well form a flexible structure.

3. The chip carrier according to claim 1 wherein the outer well includes an outer wall and an inner wall and the inner well includes an outer wall coupled to the inner wall of the outer well.

4. The chip carrier according to claim 1 further comprising an integrated circuit removably positioned on the base.

5. The chip carrier according to claim 1 further comprising:
   an upper surface;
   an integrated circuit positioned on the base and below the upper surface, the integrated circuit having leads;
   wherein the inner well has a base, the leads positioned above the base and below the upper surface.

6. The chip carrier according to claim 1 wherein the base, the inner well, and the outer well form an integrated circuit carrier and the chip carrier further comprises a plurality of integrated circuit carriers.

7. The chip carrier according to claim 1 further comprising a cover adapted to hold an integrated circuit in the chip carrier.

8. The chip carrier according to claim 1 further comprising a cover for holding an integrated circuit in the chip carrier.

9. A chip carrier comprising:
   a base having a surface and a periphery;
   an inner well having a periphery extending along the periphery of the base and wherein the inner well has a second base having a second depth between the second base and the surface;
   an outer well extending along the periphery of the inner well, and wherein the outer well has a first base having a first depth between the first base and the surface, wherein the first depth is greater than the second depth; and
   the chip carrier adapted to temporarily hold an integrated circuit in the chip carrier.

10. The chip carrier according to claim 9 wherein the base, the inner well, and the outer well form an integrated circuit carrier and the chip carrier further comprises a plurality of integrated circuit carriers.

11. The chip carrier according to claim 9 further comprising a cover adapted to hold an integrated circuit in the chip carrier.

12. The chip carrier according to claim 9 further comprising a cover for holding an integrated circuit in the chip carrier.

13. The chip carrier according to claim 1 wherein the first depth is about 1.219 mm and the second depth is about 0.869 mm.

14. The chip carrier according to claim 1 wherein at least one of the outer well or the inner well encircle the base.

15. The chip carrier according to claim 1 further comprising an upper surface and wherein the outer well extends farther away from the upper surface than the inner wall.

16. The chip carrier according to claim 15 wherein the outer well extends about 2.716 mm away from the upper surface and the inner well extends about 2.366 mm away from the upper surface.

* * * * *